Jan. 2, 1962 H. D. PETRI 3,015,718

ELECTRICAL ASSEMBLY

Filed Dec. 11, 1958 3 Sheets-Sheet 1

INVENTOR:
HECTOR D. PETRI,
BY James B. Tiffany Jr.
ATTORNEY.

ELECTRICAL ASSEMBLY

Filed Dec. 11, 1958 3 Sheets-Sheet 2

INVENTOR:
HECTOR D. PETRI,
BY
ATTORNEY.

ELECTRICAL ASSEMBLY

Filed Dec. 11, 1958 3 Sheets-Sheet 3

INVENTOR:
HECTOR D. PETRI,
BY James B. Tiffany Jr.
ATTORNEY.

United States Patent Office 3,015,718
Patented Jan. 2, 1962

3,015,718
ELECTRICAL ASSEMBLY

Hector D. Petri, Framingham, Mass., assignor to United-Carr Fastener Corporation, Cambridge, Mass., a corporation of Delaware Filed Dec. 11, 1958, Ser. No. 779,692
1 Claim. (Cl. 240—8.16)

This invention relates to an electrical assembly and in particular to a printed circuit instrument light housing having conductive material stamped on a preformed housing.

Heretofore in the assembly of automotive wiring systems, printed circuit boards consisting of conductive elements adhered to a flat fibre board have been utilized in conjunction with the stamped metallic instrument housing. This has resulted in the elimination of wiring, to the individual indicator lamps and provided a relatively inexpensive installation. However, difficulties have been experienced in mounting the fibre board in a metallic housing due to warping with the resultant poor electrical contact and in extreme cases cracking of the printed circuit.

Further developments in the plastic fields have resulted in production of molded housings having integrally molded lamp sockets and reflective shields and a need had developed for producing an electrical circuit stamped directly on the molded housing which overcomes the obvious faults of a flexible fibre board circuit.

The object of this invention is to provide a molded structure having a printed circuit adhered thereto for use as an instrument light housing in motor vehicles.

Another object of this invention is to provide a molded instrument light housing having a printed circuit adhered thereto in which the interior of the housing has a reflective characteristic due to the inherent qualities of the material.

Still another object of this invention is to provide a molded instrument light housing having printed circuit means stamped thereon in which the lamp sockets are universal in diameter.

A further object of the invention is to provide a printed circuit by one of the known means on a multiplaned hollow housing.

Other objects of the invention will, in part, be obvious, and will, in part, appear hereinafter.

Figure 1:
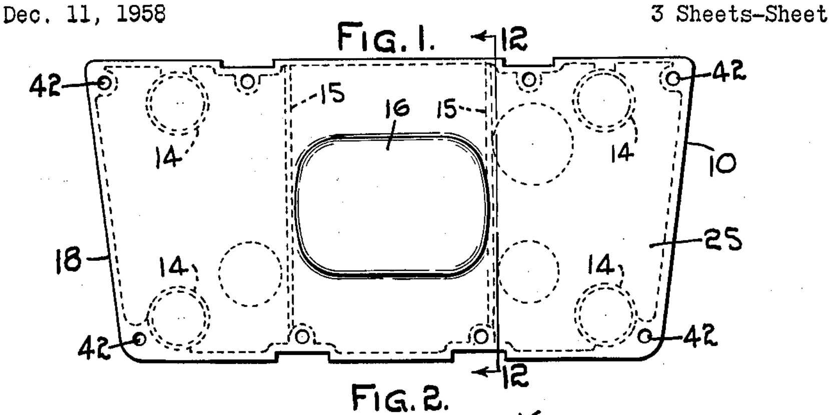
FIG. 1 is a top plan view of a molded insulated instrument housing before the application of the printed circuit.
Figure 2:
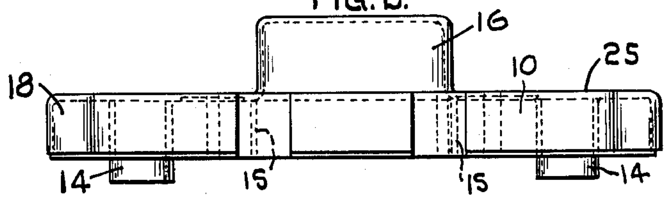
FIG. 2 is a view in front elevation of the housing of FIG. 1.
Figure 3:
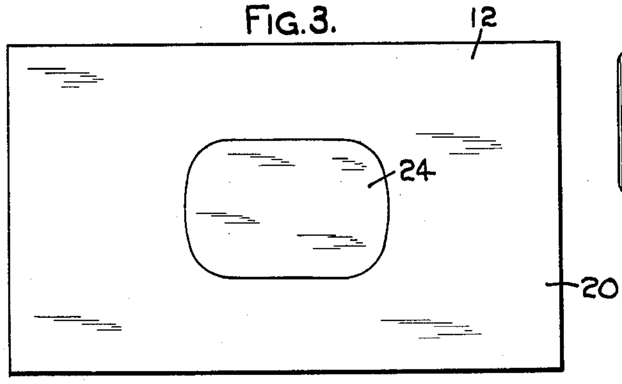
FIG. 3 is a top plan view of a blank of the conductive material.
Figure 14:
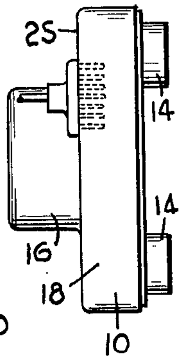
FIG. 14 is a view in elevation viewed from the right side of FIG. 6 with a connector plug inserted.

Referring to the drawings there is illustrated a reinforced molded plastic housing 10 formed of a thermoplastic of the acrylic class and the one I have found to be best adapted is acrylonitrile-butadiene styrene co-polymer upon which is stamped a thermo-adhesive or the like conductive sheet 12. The housing 10 may be molded in any form but for the purposes of simplicity I have shown a hollow rectangular member having elongated light shields 14 extending substantially perpendicular to one face of the housing and transverse ribs 15 extending across the interior of the housing. A recessed area 16 extends into the base 18 having a depth sufficient to receive a speedometer mechanism.

The conductive member 12 comprises a sheet of copper having a layer of protective solder 20 on one surface and a coating of adhesive 22 on the other surface. This conductive sheet may be of the type described in the Franklin Patent No. 2,535,674. A preliminary blanking operation is performed on the sheet 12 to remove the oblong shaped piece 24 so as to allow the sheet to be superimposed on the base 18 with the recessed area extending through the opening 24.

Figure 8:
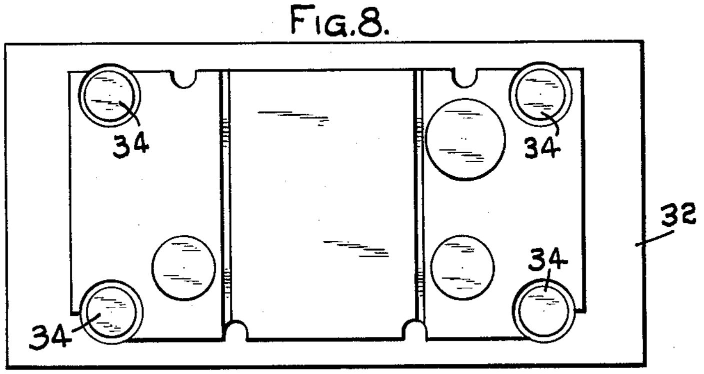
FIG. 8 is a top plan view of the mandrel used to support the housing during the cutting and stamping operation.
Figure 9:
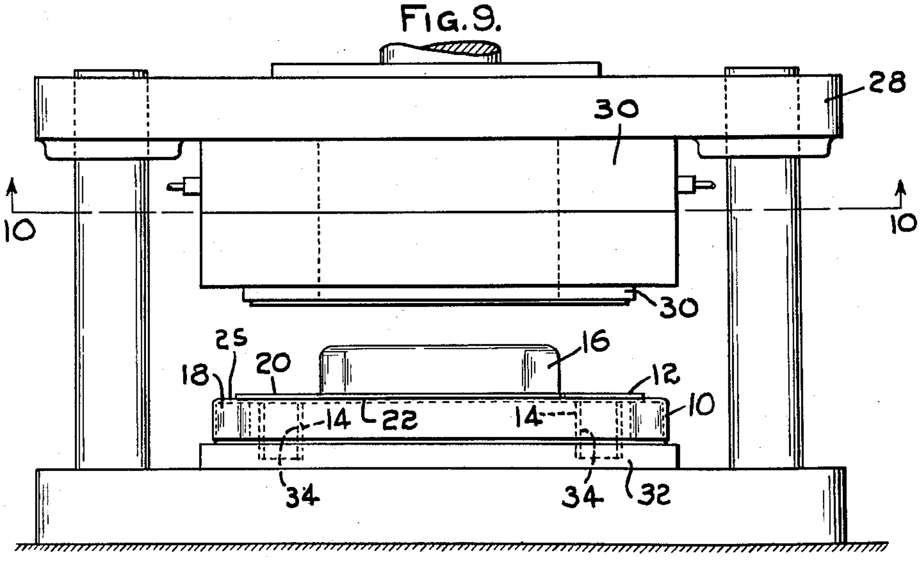
FIG. 9 is a view in front elevation of a press having the die, mandrel, and housing and conductive material in position prior to stamping.
Figure 11:
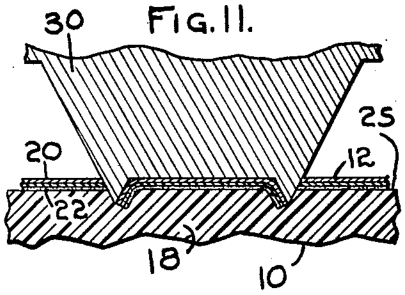
FIG. 11 is an enlarged view in section taken on line 11—11 of FIG. 6 illustrating in detail the action of the die on the conductive sheet.
Figure 10:
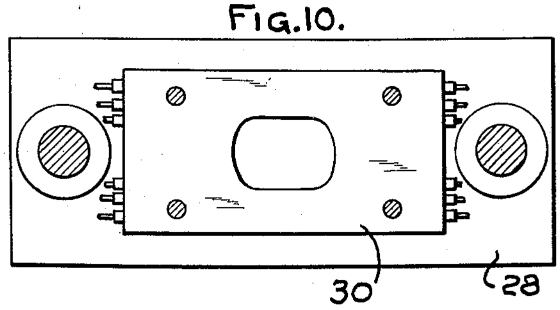
FIG. 10 is a view in section taken on line 10—10 of FIG. 9 showing the electrical connections to the heater elements.

The method of adhering the conductive sheet 12 to the surface 25 of the housing can best be described by setting forth the various stages of operation which result in the completed unit. As illustrated in FIG. 9, a press 28 having a heated die 30 axially positioned over the housing 10 which has been superimposed on a mandrel 32 and which has been illustrated in detail in FIG. 8. The housing is firmly supported by the mandrel in such a manner that posts 34 project upwardly into the reflective shields 14 and the upper surface of mandrel is in abutting relationship with the lower surface of the base 18. The sheet of conductive material 12 is superimposed on the base 18 of the housing 10 and pressure and heat is applied to the sheet by the press 28 so that as illustrated in FIG. 11, the outline of the circuitry is applied firmly to the upper surface of the housing 10. A secondary operation is performed in which the socket holes 36 are punched or cut out of the housing 10 and at the same time multi-pin type connector openings 38 and instrument or gauge mounting apertures 40 are formed. The final operation consists of stripping the unstamped portion of the conductor sheet 12 away from the adhered portion. The connector opening 38 is supplied with the required number of pin openings 41 as the point of distribution of electrical energy are supplied from an outside source (not shown).

Figures 4, 13:
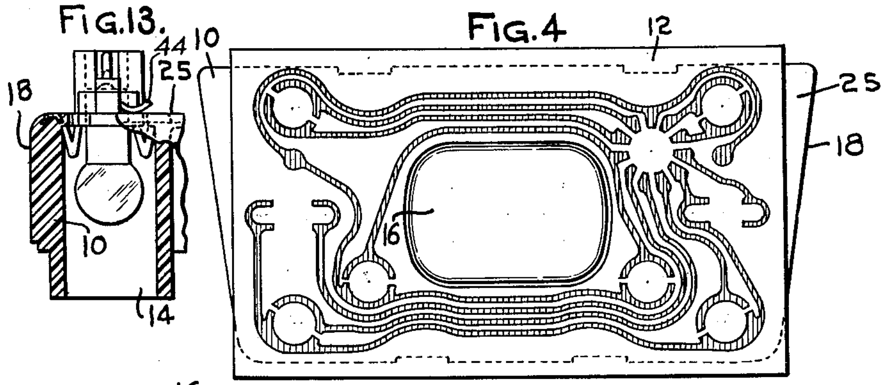
FIG. 4 is a top plan view of the blank of FIG. 3 after stamping on the molded housing.
FIG. 13 is a view in section taken on line 13—13 of FIG. 6, partly broken away and partly in elevation with a lamp socket added.
Figure 12:
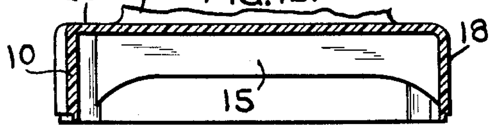
FIG. 12 is a view in section taken on line 12—12 of FIG. 1.
Figure 5:
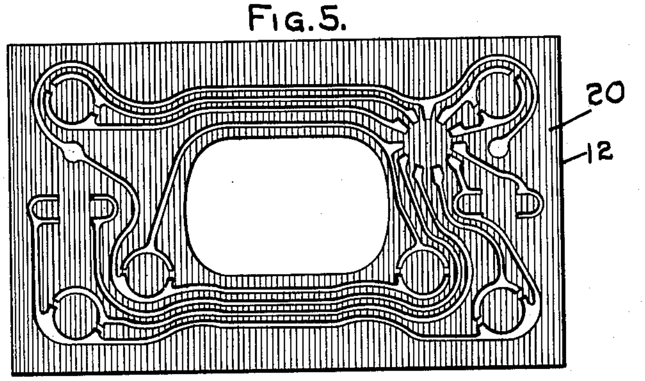
FIG. 5 is a top plan view of the material as shown in FIG. 4 after the excess material has been removed.
Figure 6:
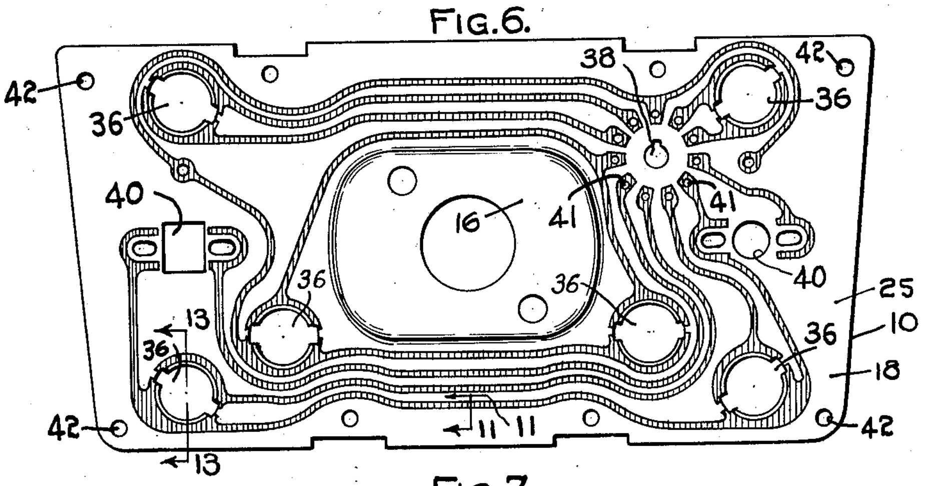
FIG. 6 is a plan view of the housing after a secondary operation of punching the sockets, connector and mounting aperture.
Figure 7:
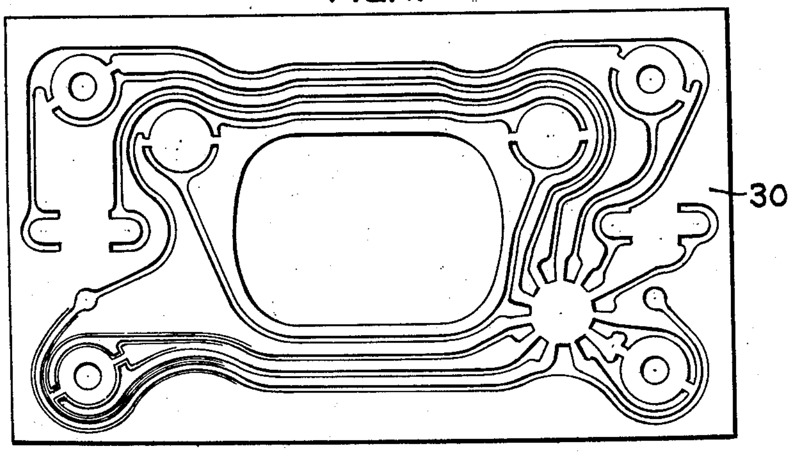
FIG. 7 is a bottom plan view of the cutting and stamping die.

As it can readily be seen the completed housing is an integral electrical unit which may be easily and simply installed behind the dashboard of a vehicle by means of the screw holes 42. Bulbs mounted in lamp sockets of the type decsribed in Patent No. 2,884,609 of Robert Fraser and Vincent Herterick having snap arms for engagement with the apertures 36 are rotated therein so that the integral contacts 44, as shown in FIG. 13, make contact with the conductive strip.

Since certain other obvious modifications may be made in this device without departing from the scope of the invention, it is intended that all matter contained herein be interpreted in an illustrative and not in a limiting sense.

I claim:

An instrument panel for mounting on a vehicle or the like comprising a one-piece housing member, first openings formed in said housing member in spaced relation to one another, lamp socket means detachably positioned in each of said first openings for receiving a light bulb therein, tubular light shield means open at both ends and integrally formed with said housing member around each of said first openings and extending from one surface of said housing member to shield a light bulb when positioned in said lamp socket means and in transverse relationship to the surface of the housing member and in axial alignment with said opening for directing light initiated therein in an axial direction, means forming a gauge housing centrally of said housing member and extending outwardly in substantially transverse relation from the other surface of said housing member in a direction opposite to that of said lamp shield means, at least one second opening formed in said housing member adjacent said gauge housing for positioning lamp socket means therein, printed electrical conductive circuit means formed on the surface of said housing member from which said gauge housing extends, said conductive means including terminal means surrounding said first and second openings for detachable electrical engagement with said lamp socket means positioned therein, and electrical source means carried by said housing member electrically connected to said printed circuit means.

References Cited in the file of this patent

UNITED STATES PATENTS

| | | |
|---|---|---|
| 2,272,806 | Klein et al. | Feb. 10, 1942 |
| 2,306,597 | Darley | Dec. 29, 1942 |
| 2,702,340 | Thieblot | Feb. 15, 1955 |
| 2,757,443 | Steigerwalt et al. | Aug. 7, 1956 |
| 2,777,192 | Albright et al | Jan. 15, 1957 |
| 2,847,560 | Peak et al. | Aug. 12, 1958 |
| 2,860,234 | Stevens | Nov. 11, 1958 |
| 2,884,609 | Fraser et al. | Apr. 28, 1959 |
| 2,923,860 | Miller | Feb. 2, 1960 |

FOREIGN PATENTS

| | | |
|---|---|---|
| 1,176,855 | France | Nov. 24, 1958 |